United States Patent [19]

Newman

[11] Patent Number: 5,047,654
[45] Date of Patent: Sep. 10, 1991

[54] SOLAR POWERED ELECTRICITY MINE SYSTEM

[76] Inventor: Edwin Newman, 10331 Lindley Ave., #113, Northridge, Calif. 91326

[21] Appl. No.: 475,370

[22] Filed: Feb. 5, 1990

[51] Int. Cl.$^5$ .................................................. H02K 7/18
[52] U.S. Cl. ................................................................ 290/52
[58] Field of Search ........................ 60/641.12; 299/14; 290/52

[56] References Cited

U.S. PATENT DOCUMENTS 4,453,383 6/1984 Collins ............................. 60/641.12
4,611,857 9/1986 Watkins ................................ 299/14

Primary Examiner—A. D. Pellinen
Assistant Examiner—Lawrence E. Colbert
Attorney, Agent, or Firm—Monty Koslover Assoc.

[57] ABSTRACT

A system for the collection and conversion of solar radiated power into electrical energy. The system improves present solar power conversion systems by locating key elements deep underground, thereby greatly decreasing thermal losses and increasing system efficiency to an estimated 80 percent. In particular, a vertical mine shaft, at least 100 meters deep is used for transmitting collected solar flux from above ground heliostat fields, down to an insulated boiler. The boiler converts injected water into superheated steam which drives a steam turbine connected to an alternator or generator producing 50 to 100 Mw electrical power. Provision is made for an auxiliary drive system, using stored water or stored heat to operate the generator during hours of darkness or high load demand.

13 Claims, 2 Drawing Sheets

SOLAR POWERED ELECTRICITY MINE SYSTEM

BACKGROUND OF THE INVENTION

1. Field of the Invention

This invention relates to solar power plants and more particularly, to a high efficiency system combining heliostats for collecting solar energy with subterranean boilers, heat exchangers and electric power generators.

2. Description of the Prior Art

Solar powered electricity generating systems are well known. One recently installed system is currently operating at a desert site near Barstow, Calif. In this system, heliostat fields of concentrating mirrors are arranged around central locations on which are placed receiving boilers. The boilers produce steam to operate turbine generators, producing an electric power output in the order of 80 megawatts. The estimated overall efficiency of the Barstow system is in the vicinity of 50%, due primarily to high thermal losses from the boiler to the turbine.

Another of the several known solar power generating systems is described in U.S. Pat. No. 3,892,433 by Floyd A. Blake. Blake discloses a fan shaped array of concentrating mirrors, mounted to track the sun and to concentrate the reflected solar rays into the aperture of an above-ground tubular boiler. The boiler produces superheated steam to drive a turbine generator. Of particular note, the system is designed to be matched with an existing hydroelectric system and augments it. The system as disclosed, does not appear to operate at a higher efficiency than prior systems, although the disclosed concentrating heliostat is an improvement. The heat losses, boiler to turbine generator, are expected to be similar to prior art installed systems.

Other patents, such as U.S. Pat. No. 4,318,393 by Richard J. Goldstein are concerned with solar energy receivers and power collection. In Goldstein's invention, a porous surface receiver and concentrator of reflected radiation is disclosed. The receiver is intended for use in a concentrating solar collector system which may be integrated with a power conversion system.

Turbine-generator systems utilizing steam, gas or high velocity water, are of course well established, as is also the case for the use of an elevated fluid storage reservoir as a hydroelectric augmentation.

Solar power electrical generating systems described heretofore in the literature or operating in installed systems include some or all of the above-described elements. However, none of the known systems include a method of subterranean processing of collected solar energy in order to increase the system efficiency. In general, all the known above-ground systems for collecting and converting solar energy suffer relatively high thermal losses at the collecting boiler to turbine or other devices.

SUMMARY OF THE INVENTION

The present invention is a solar power thermal conversion system intended to minimize thermal losses by locating key elements of the system underground; in particular, using a vertical mine shaft for location of the boiler and locating a turbine generator nearby. The system comprises a number of heliostat fields, receiving towers for each of the fields, a central collection mirror mounted above a mine shaft extending at least 100 meters below ground, an insulated boiler at the bottom of the shaft, an underground turbine-generator system to produce electric power and an auxiliary generator drive system means. In operation, the heliostat mirrors track the sun and reflect its concentrated rays on to a prism located on the top of a tower at the focal point. The prism directs the concentrated solar flux to a central collection mirror that in turn, directs the solar flux down a 100 meter deep mine shaft, through a glass lens and into the aperture of an insulated boiler. Cooled water or other fluid is piped into the boiler lining. This fluid is converted to superheated steam by the internal boiler heat. The steam is caused to drive a nearby underground turbine generator. For this application, the turbine generator may be sized to output 50 megawatts or perhaps 100 megawatts electrical power. The turbine exhaust steam is condensed and piped to radiators which are located under each heliostat field and the cooled fluid is then returned to the boiler.

As an auxiliary to the primary system, a water-driven turbine is connected by shaft to the generator. During sunlit hours, a pump which is powered by the generator output pumps previously stored water from a location below the turbine up to an above-ground storage tank. Alternatively, a thermal storage tank may be employed, heated by water/steam from the boiler during daylight hours. The thermal storage tank would release heat to the boiler circuit during night time hours.

The improvements and advantages of the above-described system stem primarily from the negligible heat loss from the subterranean boiler and turbine. This contrasts with a typical heat loss from boiler to turbine of 45% or more for prior art systems.

The principal object of the present invention is to provide a method and system of producing solar powered electricity that will be highly efficient in operation, producing non-polluting electric power at a relatively low cost per kilowatt-hour. Another object is to provide a method and system of producing solar powered electricity that can be located in any area, independent of external water sources.

Further objects and advantages of the present invention will become apparent from a study of the following portion of the specification, the claims and the attached drawings.

DESCRIPTION OF THE PREFERRED EMBODIMENT

Figure 1:
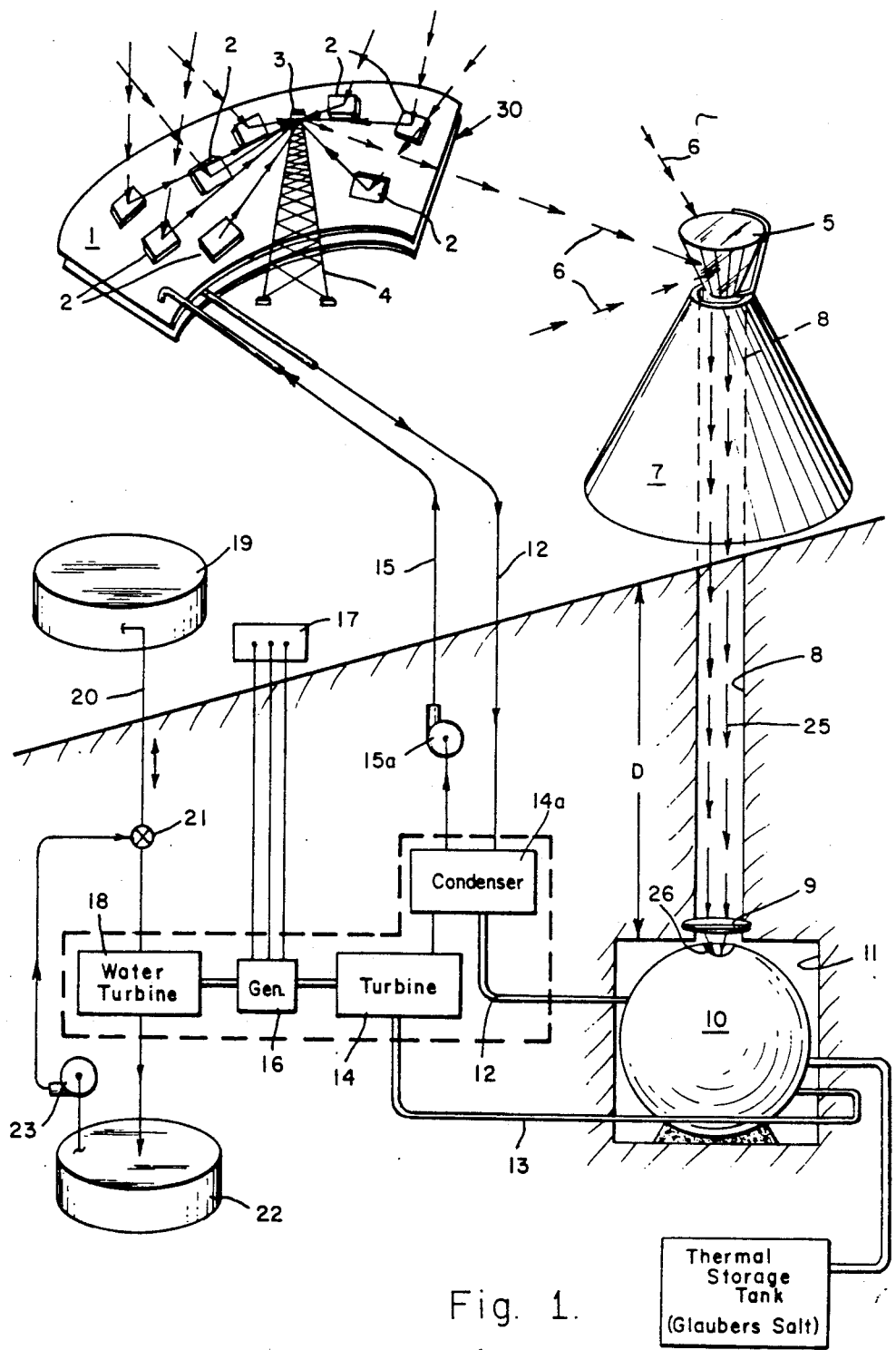
FIG. 1 is a schematic representation of a solar powered electricity mine system, particularly showing one of a multiple number of heliostat fields supplying a central receiver with reflected, concentrated solar flux; the solar energy being transmitted down a mine shaft to a boiler for converting water to superheated steam for driving a turbine generator, forming one embodiment of the present invention.

Refer to FIG. 1 which illustrates the proposed system schematically. A multiple number of heliostat fields 1 are incorporated in the system. Each heliostat field 1 comprises a plurality of reflecting mirrors 2 that may be set up to automatically track the sun or may be in a fixed position. The mirrors are shaped and mounted in an orientation to concentrate the incident solar insulation on their surfaces and to focus the concentrated flux on a prism 3 which is mounted on top of the heliostat field tower 4.

The number and size of the heliostat fields 1 depend on the installed peak electrical power output of the system and the latitude location of the solar arrays. At a latitude of 35 degrees north, which is the latitude of southern California and the southwest desert areas, the peak solar insolation at noon varies from approximately 800 w/sq.m to 1 kw/sq.m. For a 100 megawatt system such as described herein installed at 35 degrees latitude, at an overall conversion efficiency of 80%, approximately 160,000 sq.m of reflecting mirrors would be required. This is an order of magnitude estimate only. The actual design area selected would also depend on factors such as whether the heliostat mirrors tracked the sun or were fixed in position and the reflectivity of the mirrors. Eight heliostat fields, each having 20,000 sq.m of reflecting mirrors could suffice for a 100 megawatt system. The required area for the installation including the central mirror 5 and mine shaft 8 is approximately 3 sq.km. This kind of real estate is typically available in the southwestern desert areas of the United States, which would make an ideal location for the proposed installation.

Referring again to FIG. 1, the collected solar insolation from each of the heliostat fields 1 is transmitted 6 by the prism 3 on the top of each tower 4 to the central mirror 5, from whence the solar flux is reflected down a mine shaft 8 through a glass lens 9 and into the aperture of a boiler 10, where it heats the boiler walls 28 which in turn, transfers the heat to water converting it to superheated steam.

The central mirror 5 sits on top of a hill 7 in which there is located the vertical mine shaft 8. The hill 7 may be artificial or it may be a natural hill, if such is available at the desired location.

The mine shaft is approximately 5 meters in diameter and extends from the top of the hill 7 to a depth "D" of at least 100 meters below the ground surface. The boiler 10 has an insulated outer surface and will lose very little heat to the earth walls 11 of its enclosure. The placement of a glass lens 9 above the boiler aperture, separates the boiler 10 in its enclosure from the shaft 8 and insures that heat from the boiler 10 is trapped around the boiler and not permitted to escape up through the shaft 8. Silica glass may be used for the lens 9 or another suitable material, capable of withstanding the considerable heat generated by the solar flux. An insignificant amount of heat will escape to the surface up the mine shaft 8 since this is a column of still air over 100 meters long with negligible convection. Furthermore, the walls of the mine shaft 8 are covered with a polished reflecting material to reflect downwards any solar flux light that might strike the walls. The overall heat losses down the mine shaft 8 are estimated as less than 5 percent of the total flux equivalent.

The means for converting superheated steam from the boiler 10 to electric power output comprises a steam turbine 14 driving an alternator or electrical generator 16 plus a condenser 14A.

Superheated steam 13 from the boiler 10 is piped to the steam turbine 14 which is preferably located in an underground chamber within a few meters of the boiler 10. The piping between the boiler 10 and the turbine 14 should be fully insulated by wrapping and by the surrounding earth, so that heat loss will be minimal.

It is understood that after a period of time, the earth situated between the boiler 10 and the turbine-generator system will heat up, due to absorption of heat losses. If there is sufficient heat built up to create a problem, one solution is to dig a geothermal well to the heated area, extracting the heat for possible use on the surface.

The turbine 14 is connected by shaft to an alternator or generator 16 which produces 50 to 100 Mw electrical power and delivers it to terminals 17 above ground. As an auxiliary drive system for the generator 16, a water driven turbine 18 may also be coupled to the generator 16 to drive it when insufficient steam drive is available from the boiler 10 for the load. The water turbine 18 is driven by water from a storage tank 19 which is located above ground. The water is thus supplied at a head of more than 100 meters, by means of a pipe 20 and through a control valve 21 to the turbine 18, exhausting from the turbine 18 to a lower storage tank 22. During daylight hours, an auxiliary pump 23 which is powered by the generator 16 output, pumps the water stored in the lower storage tank 22 back up to the upper tank 19. The control valve 21 is adjusted to prevent water from flowing back to the water turbine 18. The auxiliary water drive system can be independent of external water supplies once it is initially stocked at installation, because water losses through leakage should be minimal. This auxiliary system is not essential to the overall system concept, but is merely offered as an example of energy storage for night time or high load use. Other storage system means, such as a thermal storage tank using Glaubers salt, may be used instead of the water storage system. Heat from the boiler 10 would be used to heat the thermal storage tank.

The water that is used by the boiler 10 to make steam is recycled. Upon exhaust from the steam turbine 14, it passes through a condenser 14A and is pumped through a hot water line 15 to radiators 30 that are located under each heliostat field 1. After being cooled, the water is returned by lines 12 to the boiler.

Figure 2:
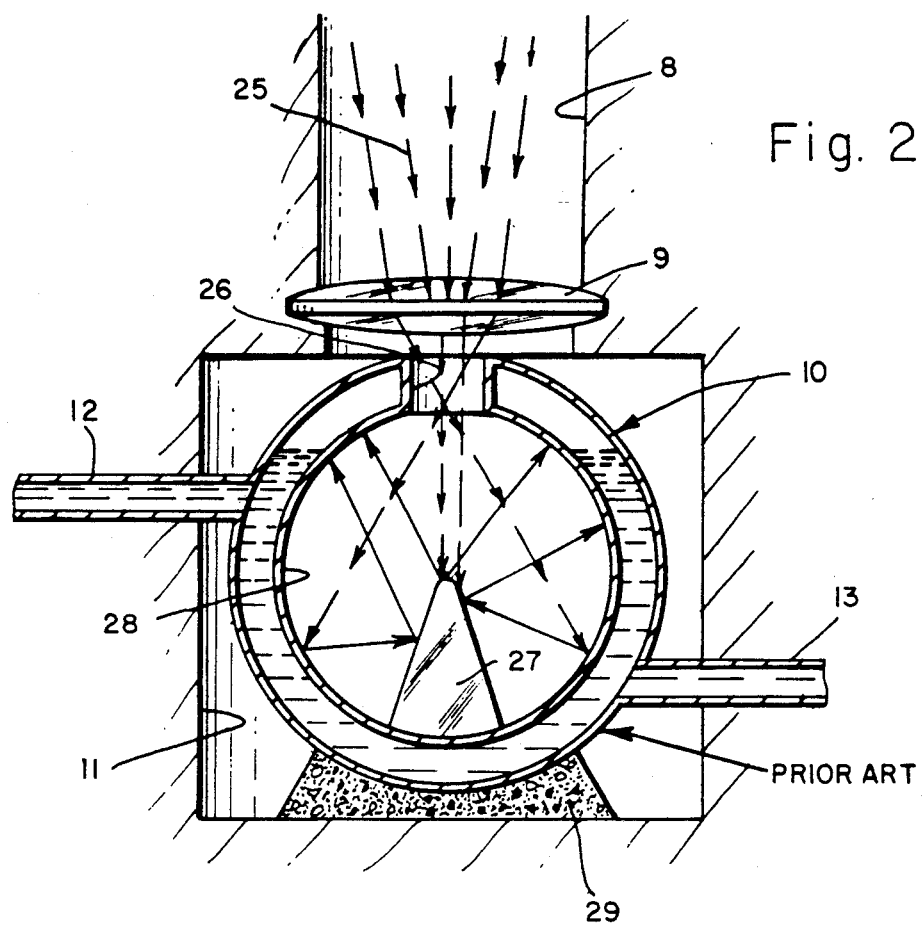
FIG. 2 is a cross-section view of the boiler and part of the mine shaft, particularly showing detail of the lens and boiler operation in receiving and utilizing the solar flux.

Referring now to FIG. 2, there is shown a simplified cross section of the boiler 10 which is located at the bottom of the mine shaft 8. The boiler 10 is preferably spherically shaped, although other suitable boiler configurations may be employed. As depicted, solar flux 25 is focussed by the glass lens 9 to enter the aperture 26 of the boiler 10. The rays entering the boiler are reflected by a receiver 27 against the black inner wall 28 of the boiler, heating the boiler wall to a temperature of 700 deg.C. The outer water channel of the boiler 10 would not, in all probability, be a single channel as shown in FIG. 2. It will rather be a large number of series connected channels, incorporating fins for the most efficient conduction of boiler heat into the water. In this manner, the entering cold water 12 will quickly flash into steam after a short distance around the boiler channels, exiting as superheated steam 13.

It is intended that the boiler 10 be firmly mounted, embedded in a concrete base 29. The outside surface of the boiler 10 should also be lagged with heat insulation, so as to decrease heat loss.

Figure 3:
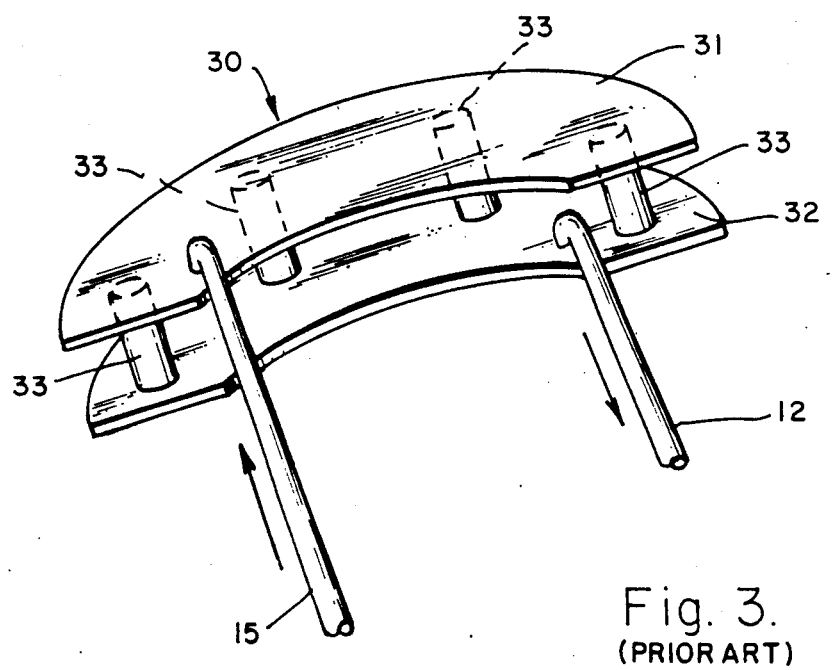
FIG. 3 is a perspective view of a typical water cooling radiator which is located under each heliostat field, particularly showing the division of the radiator into two parts; an upper section "shelf" for the incoming hot water and a lower section for the cooled water.

Referring now to FIG. 3, there is shown an embodiment of a radiator 30 that could be employed for cooling the condenser 14A water 15. Sufficient radiators 30 would be provided under the heliostat fields 1 to accommodate a day's supply of condenser water for the system. Each radiator is constructed in two levels; an upper level 31 and a lower level 32. The upper and lower levels area connected by a multiple number of pipes 33, which allow the cooled hot water to drain down to the lower level 32 prior to exiting. The water cooling and supply system, which includes the loop, radiator to condenser 14A to boiler 10 to turbine 14 to condenser 14A to radiator, is self-contained with essentially no significant losses. It therefore has the advantage of being relatively independent of an external water source except for the little required to make up unavoidable leakage losses.

Referring once more to the system schematic shown in FIG. 1, it is evident that the major contribution to system efficiency is made by the transmittal of the reflected solar flux to a location far below the surface of the ground, where the gathered heat is converted to electrical energy with minimal losses in transit. At 100 meters below a southern California desert surface, the earth temperature is typically constant the year round, and in the temperature range of 15 deg.C to 20 deg.C. This temperature, together with the inherent thermal insulating qualities of the earth, combine to produce low heat losses as compared with an above ground installation. The system heat losses, prior to conversion, are estimated as no more than 10 percent of the amount collected by the heliostats. The conversion efficiency of the turbine-generator is estimated as 90 percent. The overall estimated system efficiency, heliostats to power output, is thus 80 percent, which represented an improvement by as much as 30 percent over equivalent above-ground solar-thermal electric conversion systems.

To summarize, the proposed system process is characterized as follows:

a) Solar flux is connected by a multiple number of heliostat fields, during daylight hours;

b) The collected solar flux is transmitted by mirror from each of the heliostat fields to a central mirror;

c) The central mirror reflects all the flux down a 100 meter deep mine shaft, through a lens and into the aperture of an insulated boiler, losing very little heat to the shaft;

d) The boiler captures the incoming thermal energy by reflecting it on to the interior blackened, heat absorbing walls of the boiler;

e) Cool water from a circulating water loop is passed through heat transfer channels which are attached to and form part of the boiler, absorbing the boiler heat and changing into superheated steam;

f) The superheated steam is transmitted over a short distance through insulated pipes to a turbine which is connected by shaft to an electrical generator;

g) The electrical generator outputs electrical power which is connected by cable to terminals above ground.

In addition to the above, an auxiliary closed loop water cooling system, condenses the exhausted steam into water, transports it to cooling radiators and returns it to the boiler for reheating. A second auxiliary loop utilizes stored water from an above-ground storage tank to drive a water turbine which is connected to the generator at night, producing electrical power. The exhausted water is stored in a tank below the turbine and is pumped up to the above ground storage tank during daylight hours.

From the above description, it is believed that the preferred embodiment achieves the principal and subsidiary objects of the present invention. Alternative embodiments and various modifications of the embodiments depicted will be apparent from the above description to those skilled in the art. These and other alternatives are considered to be equivalent and within the spirit and scope of the present invention.

Having described the invention, what is claimed is:

1. A system for the conversion of solar thermal power to electrical energy, comprising in combination:
    (a) a multiplicity of heliostat fields for receiving and concentrating incident solar flux;
    (b) a multiplicity of flux receiving prisms which are each mounted on heliostat field towers, one for each heliostat field;
    (c) a central mirror for receiving the solar flux transmitted to it by said prisms; said central mirror being mounted on top of an artificial or natural hill above the opening of a vertical mine shaft;
    (d) a vertical mine shaft, approximately 5 meters in diameter and extending from the top of said hill to a depth of approximately 100 meters below the local ground surface; said mine shaft providing an insulating enclosure for downward transmission of said solar flux from said central mirror;
    (e) a boiler, mounted in an enclosure at the bottom of said mine shaft and having its receiving aperture located at its top center, coinciding with the center of said mine shaft; said boiler for producing superheated steam from injected water by transferring thermal heat from the received solar flux to said injected water;
    (f) a glass lens, made of a suitable material such as silica glass and mounted across said mine shaft at its bottom, separating said boiler from said mine shaft;
    (g) means for converting said superheated steam input from said boiler, to electrical power output and exhaust water; said means being located below the ground, near to said boiler in order to minimize thermal losses;
    (h) means for cooling said exhaust water and returning it for use by said boiler; and
    (i) an auxiliary drive system means, providing a renewable alternate energy source for operation during night hours or periods of high electrical load.

2. The system of claim 1, wherein each said heliostat field comprises a plurality of reflecting mirrors which are shaped and mounted to concentrate the incident solar flux on their surfaces and to focus said solar flux on a receiving prism that is located on top of said heliostat field tower.

3. The system of claim 1, wherein said vertical mine shaft is constructed with reflecting walls to reduce losses in the downward transmission of solar flux from the central mirror.

4. The system of claim 1, wherein said boiler contains a reflecting receiver which is shaped to reflect the incoming solar flux against the blackened inner wall of said boiler, heating said inner wall of said boiler to a temperature of 700 deg. C or higher; said boiler also constructed with an outer water channel incorporating fins for the most efficient conduction of boiler heat into the water flowing in said channel; said boiler being firmly mounted, embedded in a concrete base and having its outside surface lagged with heat insulation to decrease heat loss.

5. The system of claim 1, wherein said means for converting said superheated steam from said boiler to electrical power output, includes a steam turbine connected by shaft to an alternator or electrical generator which is sized to produce 50 Mw to 100 Mw electrical power and to deliver the power output to terminals located above ground; said steam turbine producing exhaust steam which is condensed to exhaust water by a condenser that is connected to said steam turbine.

6. The system of claim 1, wherein said means for cooling said exhaust water includes a plurality of radiators; each radiator being preferably located under a heliostat field and being connected by pipe to the steam turbine water condenser; the cooled water output from each radiator being connected by pipe back to said radiator and thence to said boiler water input, thereby making a closed loop system with essentially no significant water losses.

7. The system of claim 1, wherein said auxiliary drive system means includes a system comprising an above ground water storage tank, a water turbine which may be connected to the main generator or to an auxiliary generator, a below ground water storage tank for holding the effluent water from the water turbine, an auxiliary pump and a control valve, all connected by water piping; said auxiliary drive system operating by means of water flowing from said above ground tank, down through said control valve and to said water turbine at a total head of 100 meters or more, driving said turbine and exhausting into said below ground storage tank which stores the exhaust water; said exhaust water being pumped upwards by said auxiliary pump during sunlit hours, through said control valve and back into said above ground tank.

8. The system of claim 1, wherein said auxiliary drive system means includes a thermal storage tank containing Glaubers salt or equivalent to store heat during sunlit hours, said thermal storage tank being heated by the boiler, said thermal storage tank giving up heat to said boiler during night time or on demand during periods of high load use.

9. A process method for the conversion of solar thermal power to electrical energy, comprising the steps of:
(a) collecting and concentrating incident solar flux on a multiple number of heliostat fields during daylight hours and transmitting the flux to a central mirror;
(b) reflecting the concentrated solar flux by the central mirror down a 100 meter deep mine shaft, through a lens and into the aperture of a boiler, losing very little heat to the shaft;
(c) capturing the incoming thermal energy in the boiler by reflecting the solar flux on to the interior blackened, heat absorbing walls of the boiler, raising the wall temperatures to at least 700 deg.C., and losing insignificant heat amounts to the external enclosure ambient;
(d) transferring the heat from the boiler wall to cool water from a circulating water loop that is being passed through boiler heat transfer channels, absorbing the boiler heat and converting the water to superheated steam;
(e) transmitting the superheated steam from the boiler over a short distance of several meters through insulated pipes to a steam turbine; and
(f) operating the steam turbine, which is connected by shaft to an electrical generator, producing electrical power that is transmitted and connected by cable to terminals located above ground.

10. The method of claim 9, wherein step (b) includes surrounding the boiler, by use of a glass lens that is placed across the bottom of the mine shaft and above the boiler enclosure, thus preventing any warmed air around the boiler from exiting through the shaft.

11. The method of claim 9, wherein step (d) includes transferring heat from the boiler to a thermal storage tank containing Glaubers salt or equivalent, by means of a hot water/steam pipe in parallel with the superheated steam pipe; said thermal storage tank being arranged to give up heat to the boiler during night time or on demand.

12. The method of claim 9, wherein step (f) includes condensing the exhausted steam from the steam turbine to water, cooling the exhaust water by use of a multiplicity of radiators and returning the cooled water to the boiler for reheating.

13. The method of claim 9, wherein step (f) includes storing water in an above ground storage tank, driving a water turbine located below ground, on demand, with water from the above ground tank; storing the turbine exhaust water in a below ground storage tank and pumping the water back up to the above ground storage in daylight hours; said water turbine being connected to the electrical generator, providing an auxiliary drive at night time or during periods of high load demand.

* * * * *